(12) United States Patent
Mallette

(10) Patent No.: US 6,473,307 B2
(45) Date of Patent: Oct. 29, 2002

(54) METHOD AND APPARATUS FOR EFFICIENT ELECTRONICS POSITIONING AND CONNECTION SYSTEMS

(75) Inventor: Michael J. Mallette, Apache Junction, AZ (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/784,470

(22) Filed: Feb. 15, 2001

(65) Prior Publication Data

US 2002/0109972 A1 Aug. 15, 2002

(51) Int. Cl.[7] .............................. H05K 7/10
(52) U.S. Cl. .................. 361/727; 361/760; 708/100; 248/65
(58) Field of Search ................ 361/727, 683, 361/684, 686, 760, 724–726, 685–687; 360/97.8; 248/65; 708/100

(56) References Cited

U.S. PATENT DOCUMENTS 6,029,183 A * 2/2000 Jenkins et al. ............... 708/100
6,288,901 B1 * 9/2001 Liu et al. .................... 361/724
6,307,745 B1 * 10/2001 Liebenow .................... 361/686

* cited by examiner

Primary Examiner—Darren Schuberg
Assistant Examiner—Hung Van Duong
(74) Attorney, Agent, or Firm—J. D. Harriman, II, Esq.; Coudert Brothers LLP

(57) ABSTRACT

The present invention provides a method and apparatus for efficient electronics positioning and connection systems. In one embodiment of the present invention, electronic components are inserted into a connection rack from the front such that connections face the front side of the connection rack. In another embodiment of the present invention, electronic components are inserted into a connection rack from a side such that connections face the front side of the connection rack. In one embodiment, a connection rack is positioned with the back side against a wall. In another embodiment two connection racks are positioned such that the back side of a first connection rack is against the back side of a second connection rack. In one embodiment, a power supply is positioned near the top of the connection rack. A common power line couples the power supply to the electronic components. Thus, the need for heat-producing power supplies in each component is eliminated. In one embodiment, the common power line has a contiguous connector (channel). This connector couples the common power line to electronic components without additional cable.

26 Claims, 15 Drawing Sheets

METHOD AND APPARATUS FOR EFFICIENT ELECTRONICS POSITIONING AND CONNECTION SYSTEMS

BACKGROUND OF THE INVENTION

1. Field of the Invention

The present invention relates to the field of electronic connection systems, and in particular to a method and apparatus for efficient electronics positioning and connection systems.

Sun, Sun Microsystems, the Sun logo, Solaris and all Java-based trademarks and logos are trademarks or registered trademarks of Sun Microsystems, Inc. in the United States and other countries. All SPARC trademarks are used under license and are trademarks of SPARC International, Inc. in the United States and other countries. Products bearing SPARC trademarks are based upon an architecture developed by Sun Microsystems, Inc.

2. Background Art

Electronic systems are typically comprised of multiple electronic components. For example, some computer systems are comprised of multiple computers which are coupled together. For convenience, components are frequently located in the same general physical location. Prior art methods of placing multiple components in close proximity often results in tangled connection and power cables. This problem can be better understood by reviewing component positioning and connection.

Connection Racks

One prior art method of positioning and connecting electronic components uses a connection rack. A connection rack is a frame onto which components are mounted. Connection racks are designed with front and back sides, wherein a component is inserted into the rack from the front side and has power and connection cables on the back side. When multiple components are placed in a rack, the cables frequently become tangled.

One prior art method for reducing cable tangling involved bundling cables together. However, this method results in large cable bundles which make servicing components more difficult. Frequently, a cable is accidentally disconnected when moving a bundle to gain access to a component.

Prior art connection racks require an access aisle for both in front and behind the rack. The aisle in front of the connection rack allows insertion and removal of components as well as monitoring of any signals which are positioned at the front of a component. The aisle in back of the connection rack allows access to power and connection cables for the components. Thus, rows of prior art connection racks cannot be positioned against walls or against other connection racks, resulting in inefficient used of floor space.

FIG. 1 illustrates positioning of prior art connection racks in a room. Connection rack 1 (110) is positioned in the room (100) such that aisle 1 (130) is between connection rack 1 and wall 1 (160). Connection rack 2 (120) is positioned such that aisle 2 (140) is between connection rack 2 and connection rack 1. Additionally, connection rack 2 is positioned such that aisle 3 (150) is between connection rack 2 and wall 2 (170).

FIG. 2 illustrates the process of replacing a component in a prior art connection rack. At step 200, a technician accesses the back side of the connection rack. At step 210, the technician disconnects the necessary cables from the old component. At step 220, the technician accesses the front side of the connection rack. At step 230, the technician removes the old component. At step 240, the technician inserts a new component. At step 250, the technician accesses the back side of the connection rack. At step 260, the technician connects the necessary cables to the new component.

SUMMARY OF THE INVENTION

The present invention provides a method and apparatus for efficient electronics positioning and connection systems. In one embodiment of the present invention, electronic components are inserted into a connection rack from the front such that connections face the front side of the connection rack. In another embodiment of the present invention, electronic components are inserted into a connection rack from a side such that connections face the front side of the connection rack.

In one embodiment, a connection rack is positioned with the back side against a wall. In another embodiment two connection racks are positioned such that the back side of a first connection rack is against the back side of a second connection rack.

In one embodiment, a power supply is positioned near the top of the connection rack. A common power line couples the power supply to the electronic components. Thus, the need for heat-producing power supplies in each component is eliminated. In one embodiment, the common power line has multiple connectors. These connectors couple the common power line to electronic components without additional cable.

BRIEF DESCRIPTION OF THE DRAWINGS

These and other features, aspects and advantages of the present invention will become better understood with regard to the following description, appended claims and accompanying drawings where:

DETAILED DESCRIPTION OF THE INVENTION

The invention is a method and apparatus for efficient electronics positioning and connection systems. In the following description, numerous specific details are set forth to provide a more thorough description of embodiments of the invention. It is apparent, however, to one skilled in the art, that the invention may be practiced without these specific details. In other instances, well known features have not been described in detail so as not to obscure the invention.

Front Access

In one embodiment of the present invention, electronic components are inserted into a connection rack from the front such that connections face the front side of the connection rack. In this embodiment, access to only the front side of the rack is sufficient for component maintenance. Hot-pluggable components are inserted and removed from the front side of the connection rack.

Figure 1:
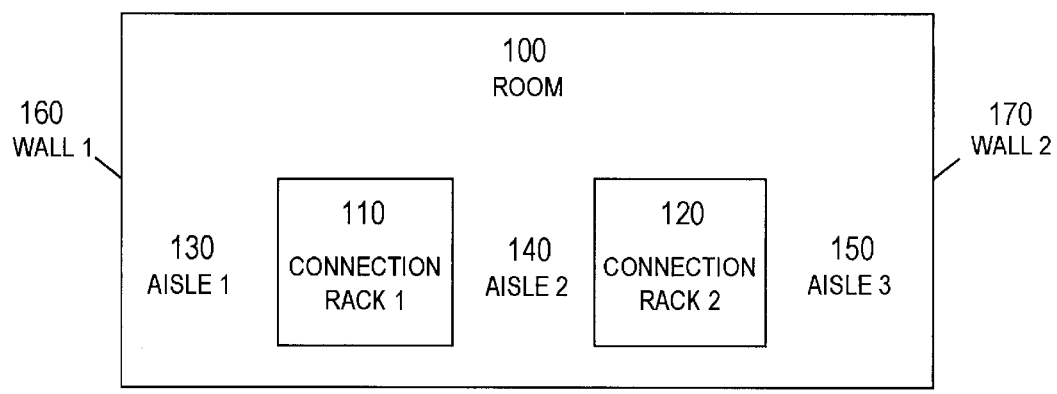
FIG. 1 is a block diagram of positioning two connection racks in a room.
Figure 2:
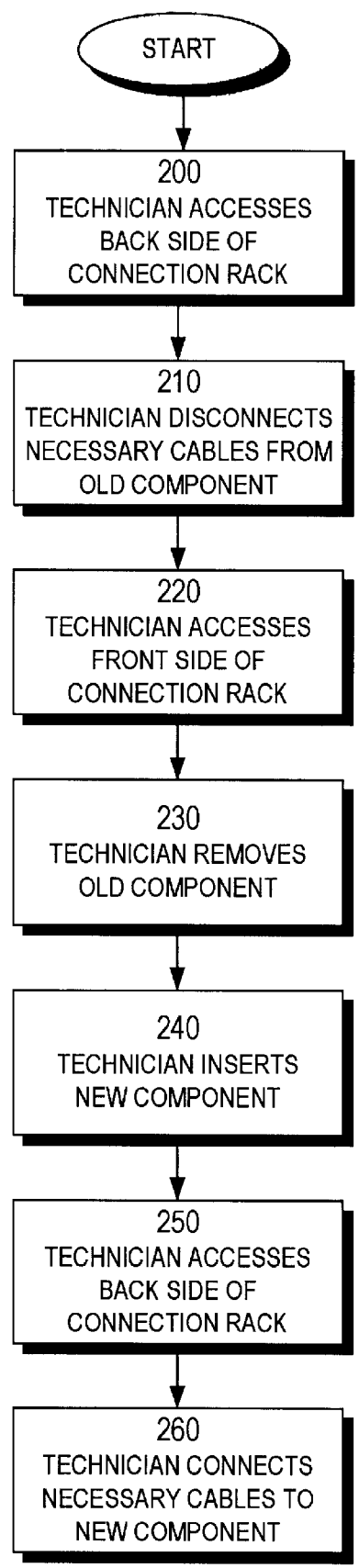
FIG. 2 is a flow diagram of the process of replacing a component in a prior art connection rack.
Figure 3A:
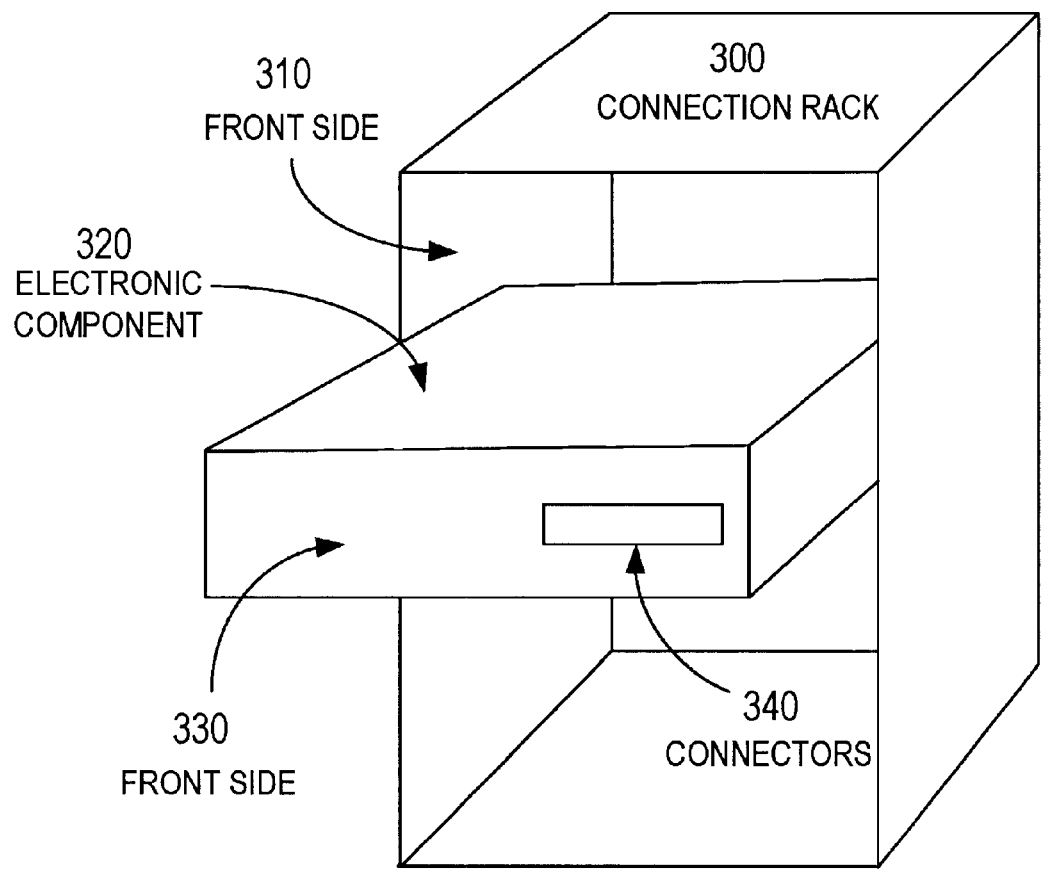
FIG. 3A is a block diagram of an electronic component and a connection rack in accordance with one embodiment of the present invention.

FIG. 3A illustrates an electronic component and a connection rack in accordance with one embodiment of the present invention. An electronic component (320) is inserted into the connection rack (300) from the front side (310) of the connection rack. Connectors (340) for cables are positioned on the front side (330) of the electronic component. Thus, the same side of a connection rack is used for both cable connection and/or disconnection and electronic component connection and/or removal.

Figure 3B:
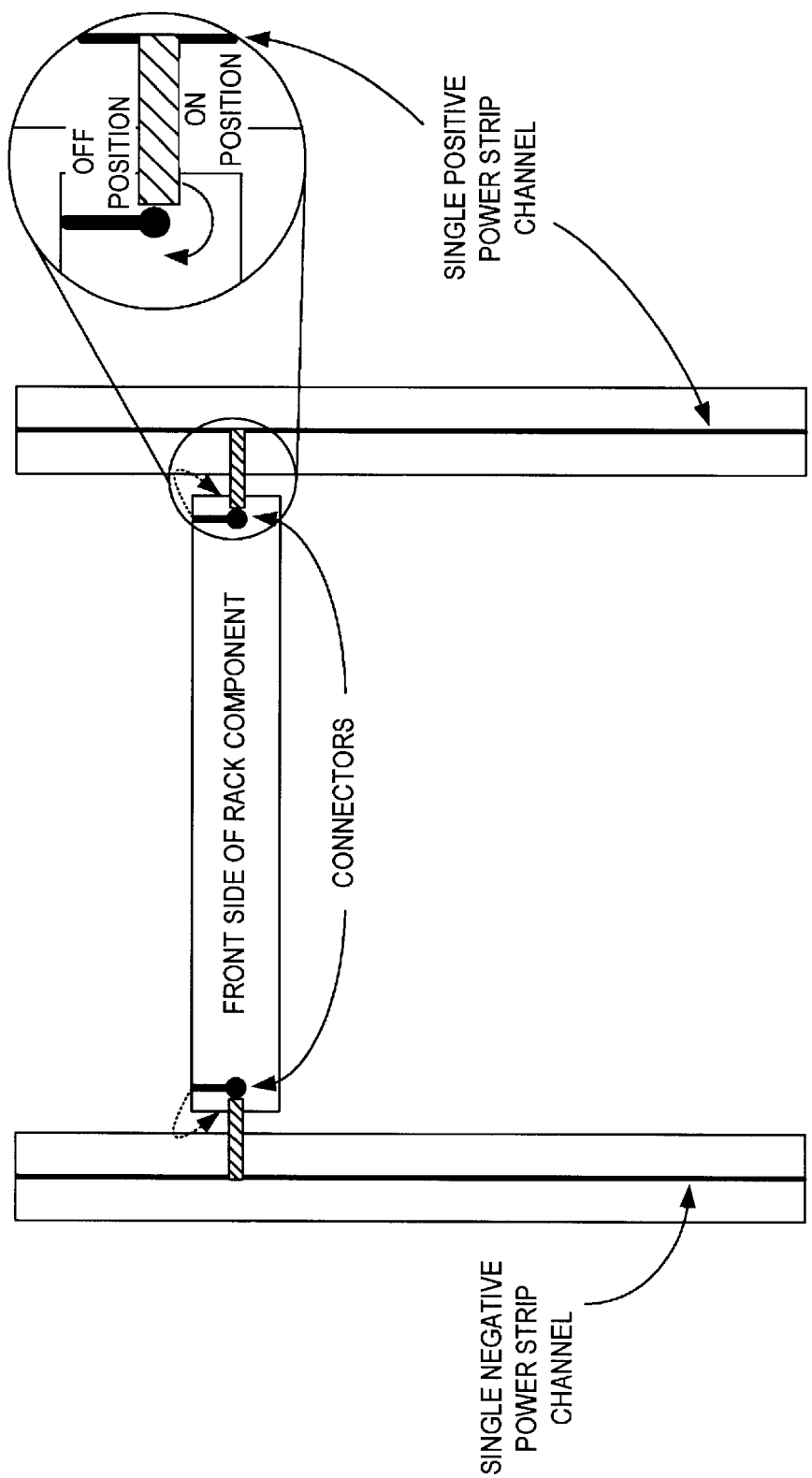
FIG. 3B shows a design of a DC power strip channel in accordance with one embodiment of the present invention.
Figure 3D:
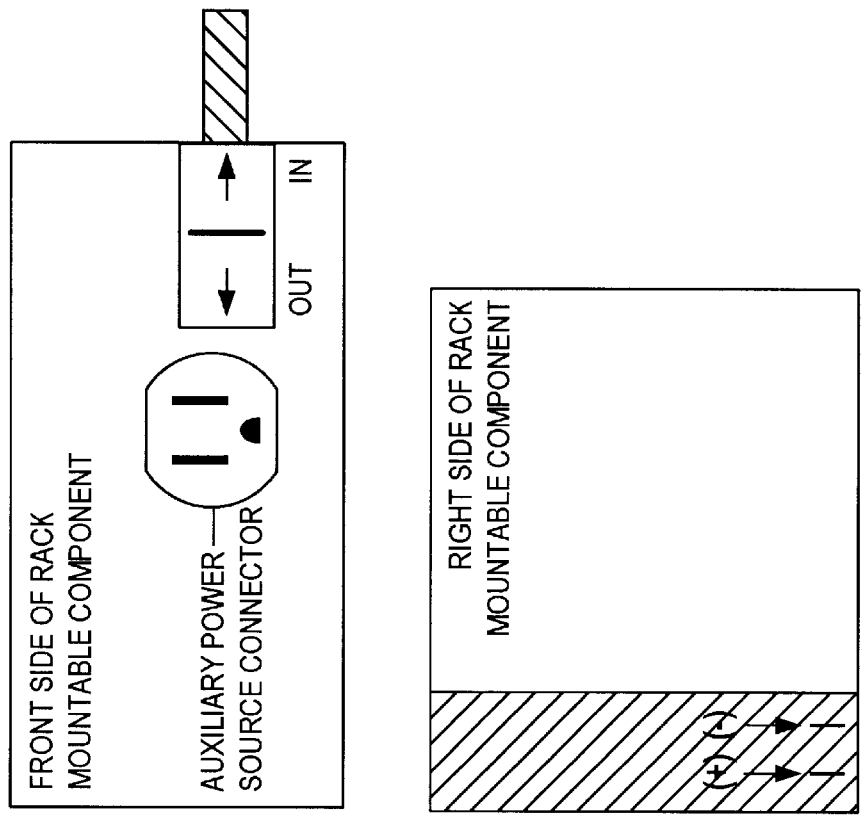
FIG. 3D shows a design of a connector in accordance with one embodiment of the present invention.
Figure 3C:
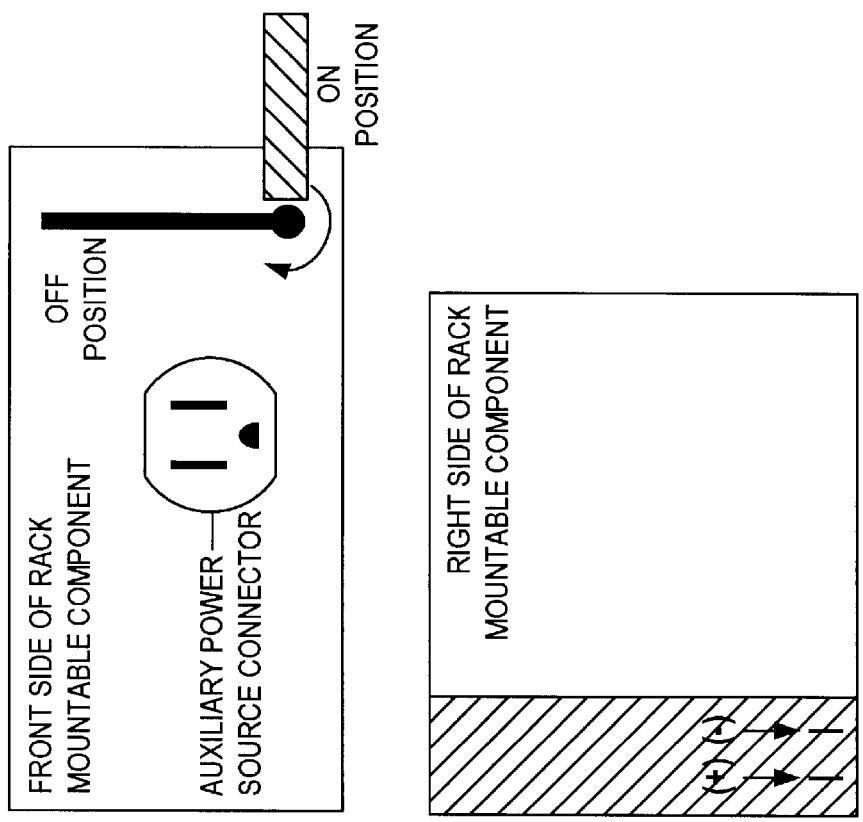
FIG. 3C shows a design of a connector in accordance with one embodiment of the present invention.
Figure 3E:
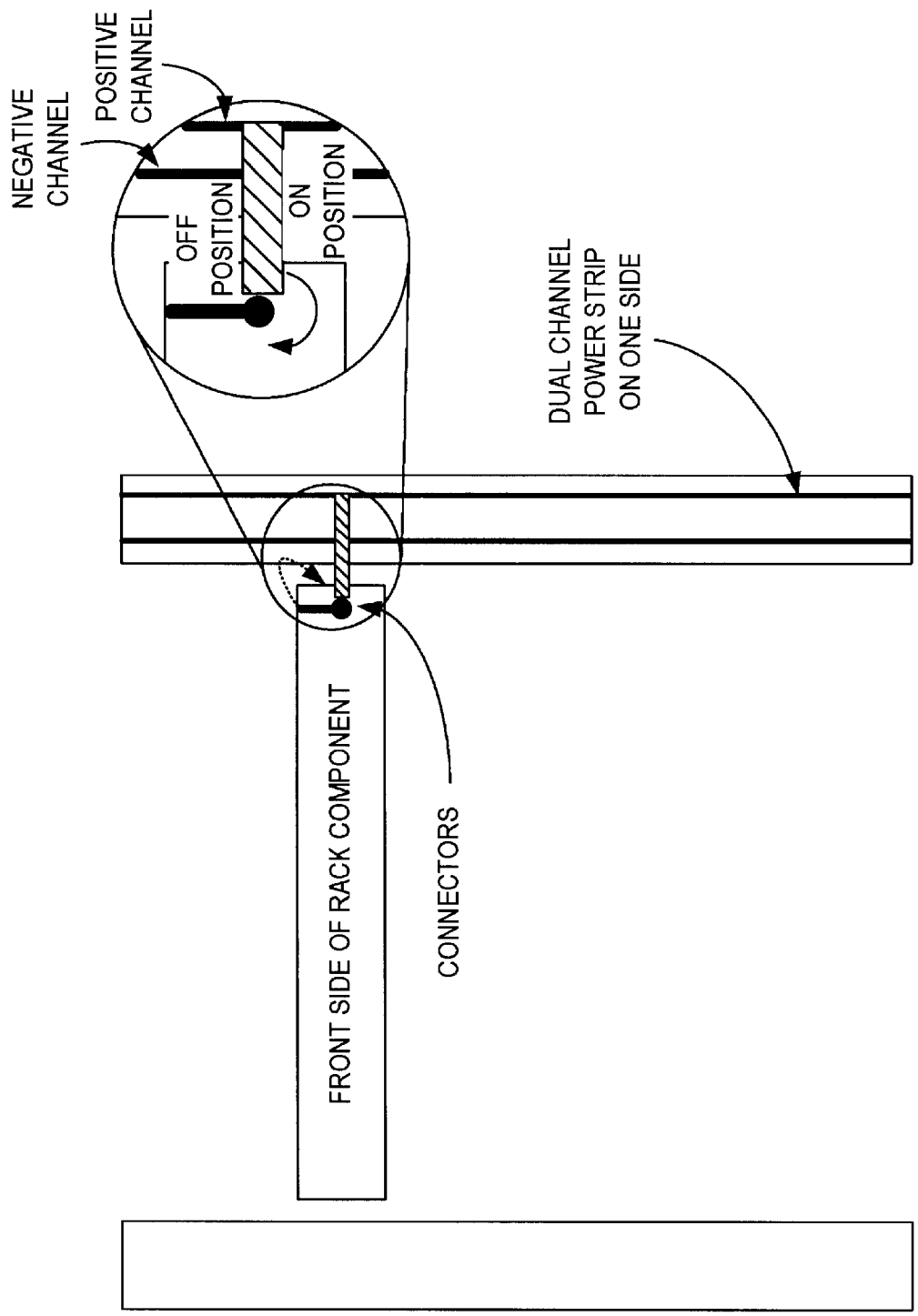
FIG. 3E shows a design of a DC power strip channel in accordance with one embodiment of the present invention.

FIGS. 3B, 3C, 3D, 3E and 3F show different kinds of connectors, power strip designs, and the overall look of an AC or DC power strip attached to the front of a cabinet. FIG. 3B shows a design with two separate power strip channels for positive and negative DC current. Each of these power strip channels run along the two front edges of the rack system. In this design, there are two separate connectors, one for each power strip channel. FIG. 3E shows another design with just one dual power strip channel running along either front edge of the rack system. This dual power strip channel has one strip for negative and one for positive DC current. This design warrants just one connector for the cables and is positioned on the side of the electronic component closest to the dual power strip channel.

Using either designs, there are several kinds of cable connectors, and FIGS. 3C and 3D show a couple of different kinds. FIG. 3C shows a blade type connector which has to be rotated a quarter turn in the clockwise direction in order to make contact with the DC power strip channel. As illustrated, the "off" position is the upright position. This is the position the connector has to be before the electronic component can be removed to be replaced or serviced. If the connector is placed near the front right side of the electronic component, then the right side of the electronic component is where the plug is placed, and is illustrated in FIG. 3C. FIG. 3C also illustrates an auxiliary power connector. The auxiliary power connector is used when the component is not placed in the cabinet, when testing a component or when a temporary alternate power source is required.

FIG. 3D shows another design of the connector, where a switch type connector is used. There is a switch in the connector that slides one way to disconnect the electronic component from the DC power supply for replacement or servicing, and slides another to connect. Here too, if the connector is placed near the front right side of the electronic component, then the right side of the electronic component is where the plug is placed, and is illustrated in FIG. 3D. FIG. 3D also illustrates an auxiliary power connector. The auxiliary power connector is used when the component is not placed in the cabinet, when testing a component or when a temporary alternate power source is required.

Figure 3F:
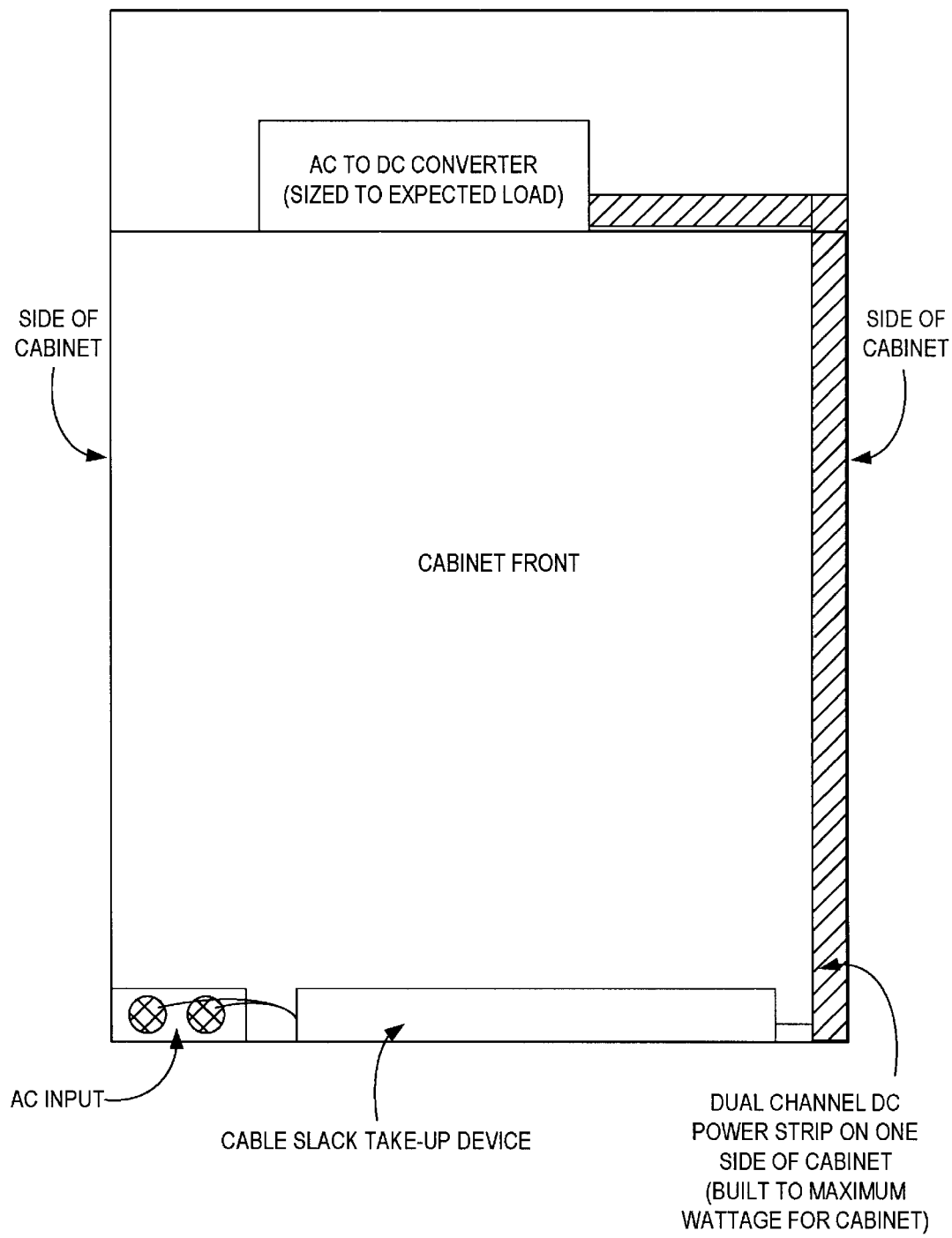
FIG. 3F shows an illustration of the frontal elevation of a cabinet in accordance with one embodiment of the present invention.

FIG. 3F shows one of the two designs of power strips mentioned in FIGS. 3B and 3E. It shows the front elevation of a cabinet that has a dual DC power strip channel attached to the front right side. In another embodiment, the power strip contains both AC and DC channels. This dual power strip is built to the maximum wattage of the entire cabinet, and is connected to a AC to DC converter placed on the topmost shelf of the cabinet. An AC supply connector is also placed in the front of the cabinet, and is seen in the left bottom corner. Based on the design illustrated in FIG. 3F, the electronic components will each have just one connector on the front side closest to the dual power strip.

Figure 4:
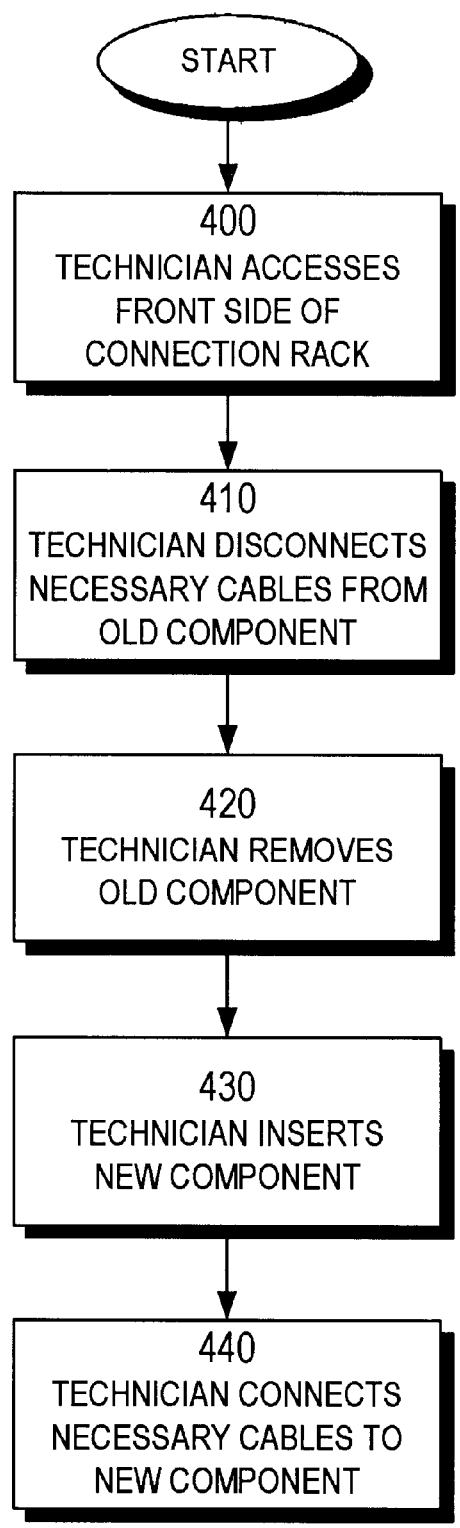
FIG. 4 is a flow diagram of the process of replacing a component in a connection rack in accordance with one embodiment of the present invention.

FIG. 4 illustrates the process of replacing a component in a connection rack in accordance with one embodiment of the present invention. At step 400, a technician accesses the front side of the connection rack. At step 410, the technician disconnects the necessary cables from the old component. At step 420, the technician removes the old component. At step 430, the technician inserts a new component. At step 440, the technician connects the necessary cables to the new component.

Side Access

In another embodiment of the present invention, electronic components are inserted into a connection rack from a side such that connections face the front side of the connection rack. In this embodiment, components are accessed without accessing the back side of the rack. In order to insert or remove a hot-pluggable component through the side of the connection rack, the connection rack is moved to a location where the side is accessible and the component is removed or added.

In one embodiment, connections face the side of the connection rack. In another embodiment, some connections face the front side of the connection rack and other connections face the side of the connection rack. In the above embodiments, component to component connections made within a connection rack are made between connections on the front side or side of the component. Thus, these component to component connections are serviced without the need to access the back of the connection rack. To service a component, the connection rack is moved so that the side of the connection rack is accessible. Then, the component and connections are accessed through the side of the connection rack and the component is serviced.

Figure 5:
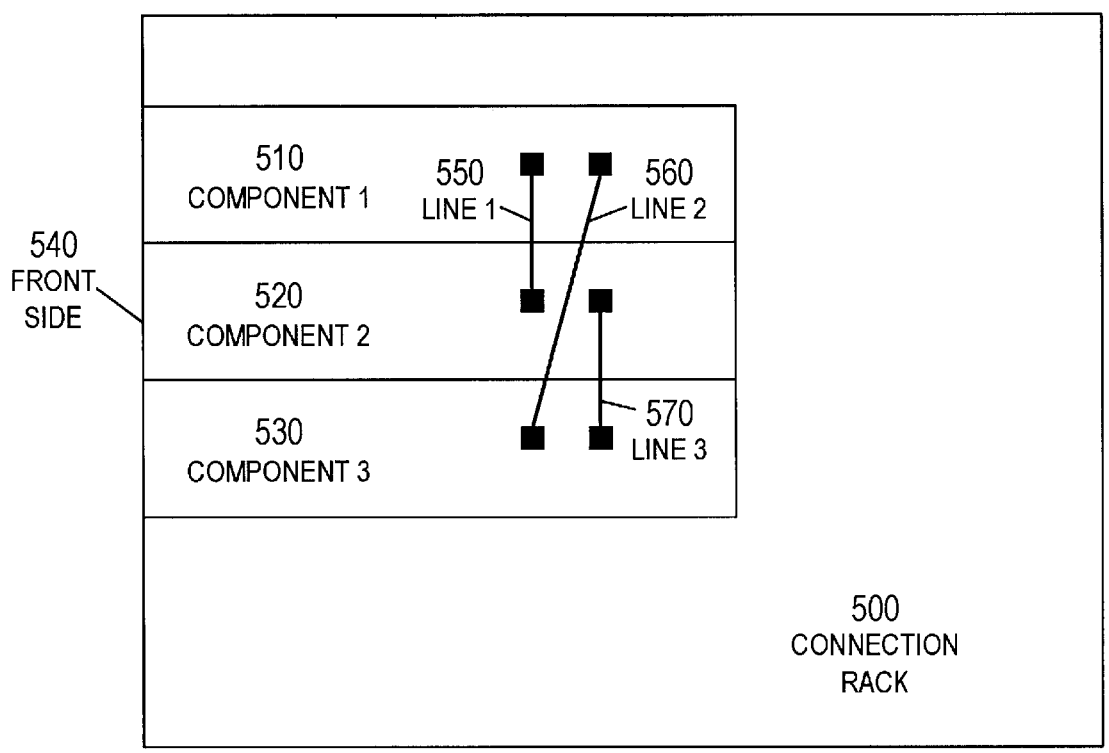
FIG. 5 is a block diagram of a connection rack where component to component connections are made on the side of components in accordance with one embodiment of the present invention.

FIG. 5 illustrates a connection rack where component to component connections are made on the side of components in accordance with one embodiment of the present invention. A connection rack (500) contains components 1 (510), 2 (520) and 3 (530). components 1, 2 and 3 are positioned near the front side (540) of the connection rack. Component 1 is connected to component 2 by line 1 (550) and to component 3 by line 2 (560). Component 2 is connected to component 3 by line 3 (570).

Connection Rack Positioning

Figure 6:
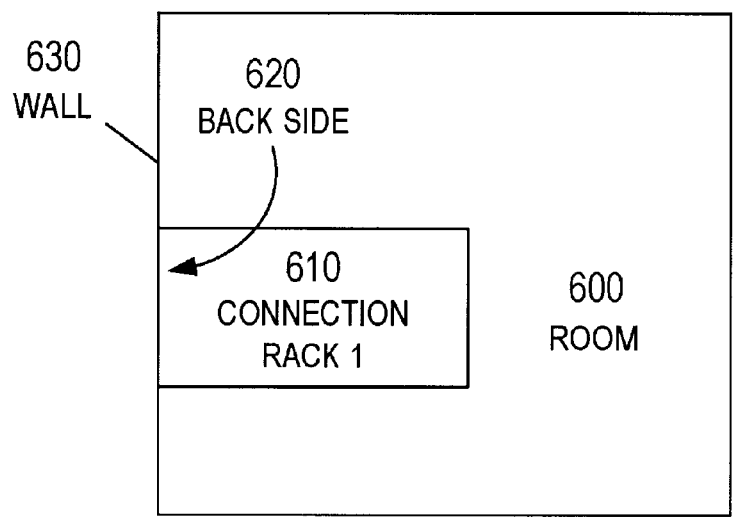
FIG. 6 is a block diagram of the positioning of a connection rack in a room in accordance with one embodiment of the present invention.

In one embodiment, a connection rack is positioned with the back side against a wall. FIG. 6 illustrates positioning of a connection rack in a room in accordance with one embodiment of the present invention. A connection rack (610) is positioned in the room (600) such that the back side (620) of the connection rack is against the wall (630).

Figure 7:
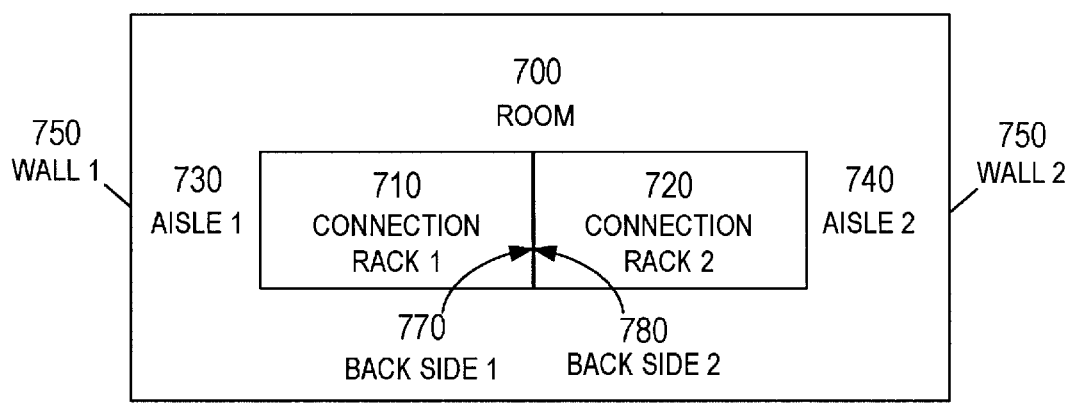
FIG. 7 is a block diagram of the positioning of two connection racks in a room in accordance with one embodiment of the present invention.

In another embodiment two connection racks are positioned such that the back side of a first connection rack is against the back side of a second connection rack. FIG. 7 illustrates positioning of two connection racks in a room in accordance with one embodiment of the present invention. Connection rack 1 (710) is positioned in the room (700) such that aisle 1 (730) is between connection rack 1 and wall 1 (750). Connection rack 2 (720) is positioned such that back side 1 (770) of connection rack 1 is against back side 2 (780) of connection rack 2. Additionally, connection rack 2 is positioned such that aisle 2 (740) is between connection rack 2 and wall 2 (760).

Figure 8A:
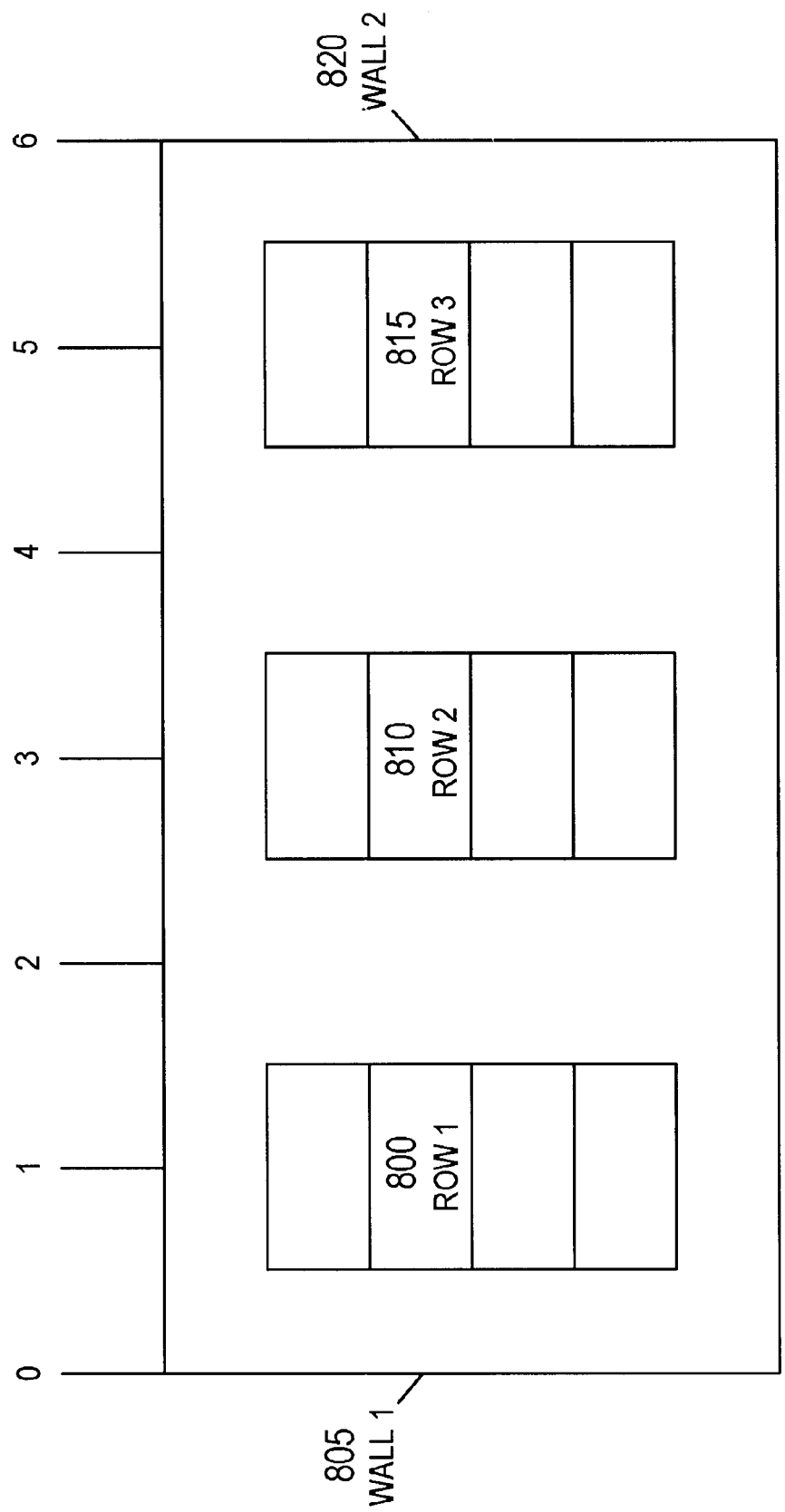
FIG. 8A is a block diagram of the number of prior art connection racks which fit into a room 6 units wide where ½ units of space are required to access components and connections and components are 1 unit wide.
Figure 8B:
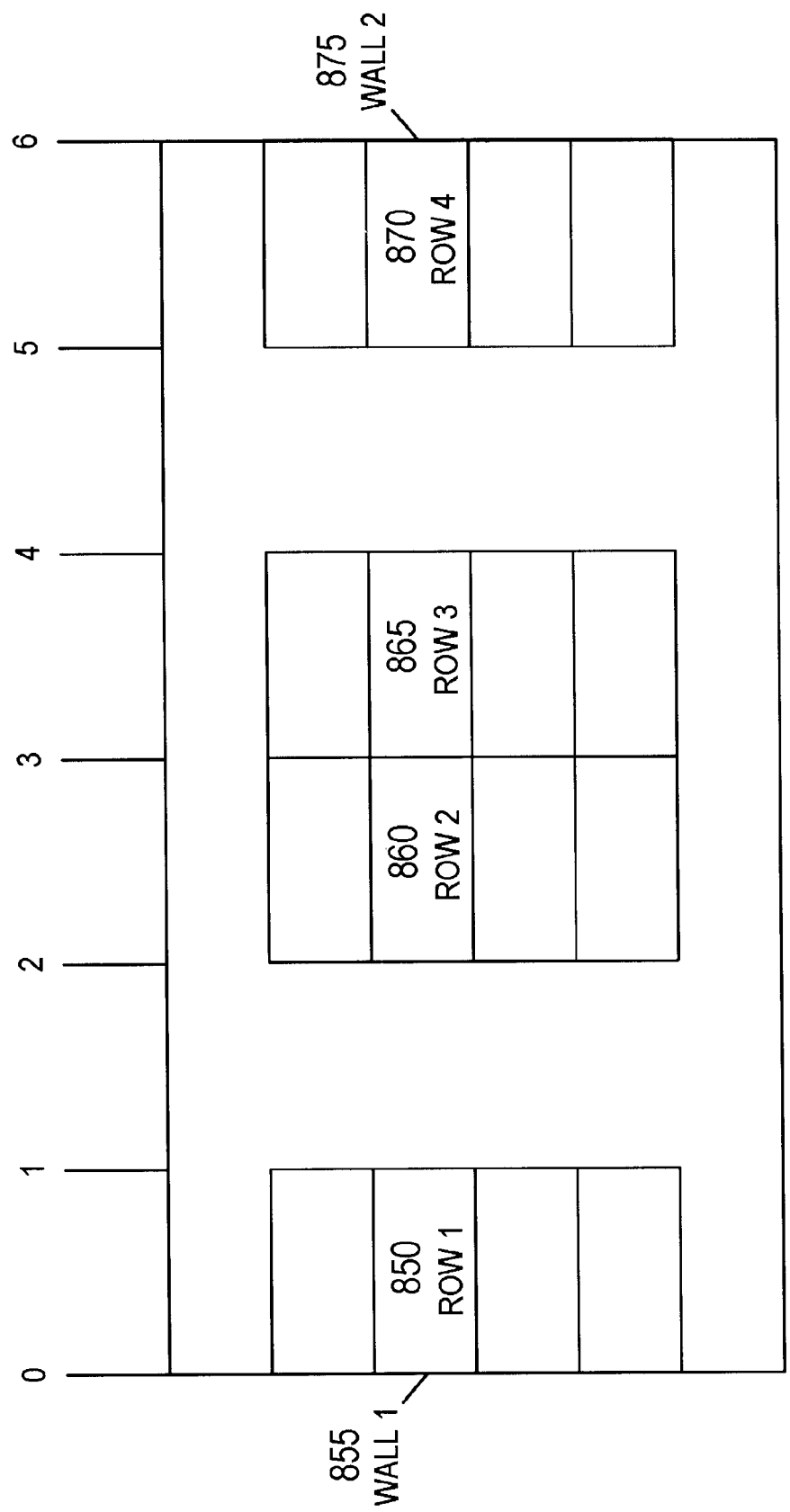
FIG. 8B is a block diagram of the number of connection racks in accordance with one embodiment of the present invention which fit into a room 6 units wide where ½ units of space are required to access components and connections and components are 1 unit wide.

FIGS. 8A and 8B illustrate the floor space-saving ability of connection racks in accordance with one embodiment of the present invention. FIG. 8A illustrates the number of prior art connection racks which fit into a room 6 units wide where ½ units of space are required to access components and connections and components are 1 unit wide. No more than three rows of prior art connection racks fit into the room. Since both the front and the back sided of a connection rack must be accessible, Row 1 (800) is ½ units away form wall 1 (805). Row 2 (810) is 2.5 units away from wall 1. Likewise, Row 3 (815) is 4.5 units away from wall 1 and ½ units away from wall 2 (820).

FIG. 8B illustrates the number of connection racks in accordance with one embodiment of the present invention which fit into a room 6 units wide where ½ units of space are required to access components and connections and components are 1 unit wide. Four rows of connection racks fit into the room. Since only the front side must be accessible, Row 1 (850) is against wall 1 (855). Row 2 (860) is 1 unit away from row 1 and directly against row 3 (865). Row 4 (870) is 1 unit away from row 3 and directly against wall 2 (875).

In one embodiment, a power supply is positioned near the top of the connection rack, and is illustrated in FIG. 3F. A common power line couples the power supply to the electronic components. Thus, the need for heat-producing power supplies in each component is eliminated. In this way, power supply heat is generated at the top of the rack, rather than throughout the rack. Thus, power supply heat does not pass through any components in the rack as it rises. Instead, as the heat rises, it is carried away from the electrical components. In the embodiment of FIG. 3F, the main power supply connection is moved to the front of the connection rack.

Figure 9:
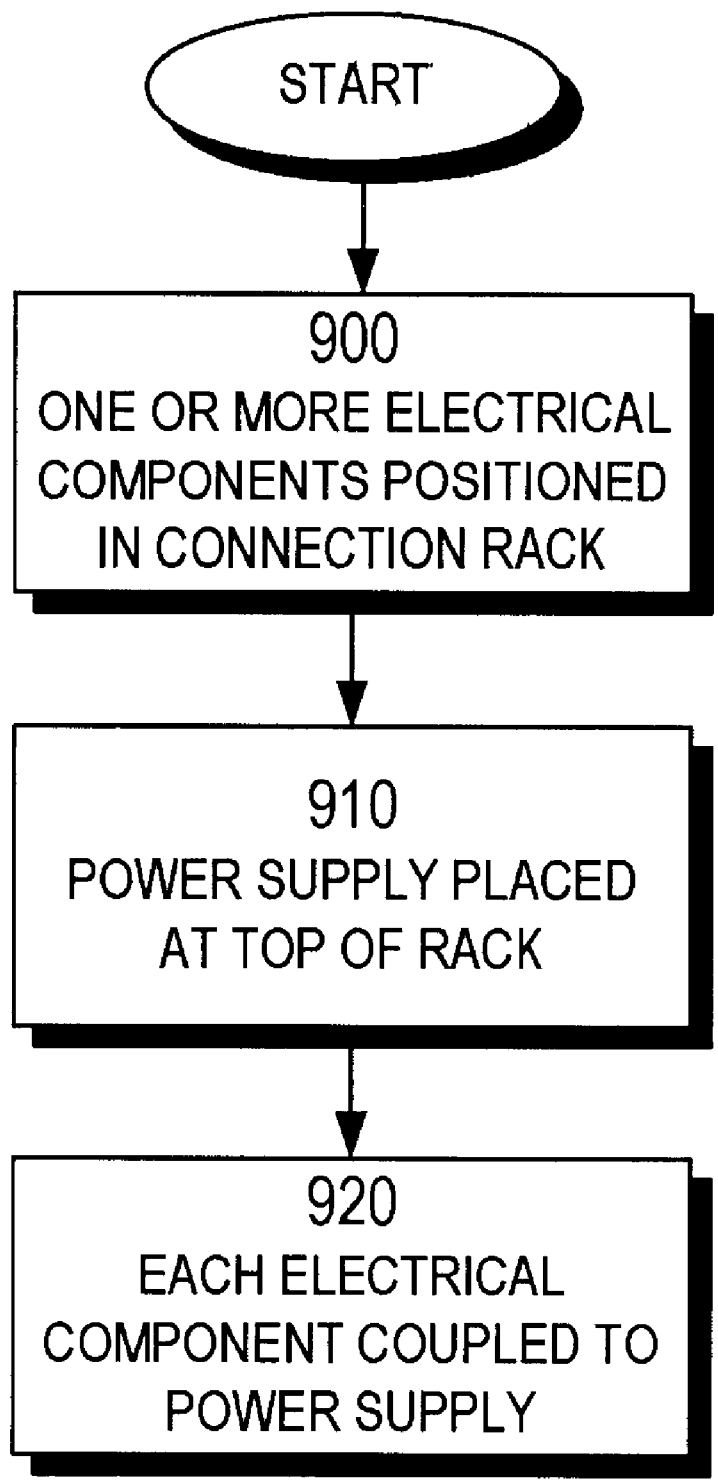
FIG. 9 is a flow diagram of the process of connecting electrical components in accordance with one embodiment of the present invention.

FIG. 9 illustrates the process of connecting electrical components in accordance with one embodiment of the present invention. At step 900, one or more electrical components are positioned in a connection rack. At step 910, a power supply is placed at the top of the rack. At step 920, each electrical component is coupled to the power supply.

In one embodiment, the common power line has a single contiguous connector (channel) for use by multiple components. These connectors couple the common power line to electronic components without additional cable. Thus, the amount of cable connected to electronic components is reduced.

Cable Slack Take-Up

In one embodiment, cables are run through a slack take-up device. The slack take-up device allow extra length of cable to be stored. As more cable is needed (e.g., sliding a component out of the cabinet without disconnecting it or sliding the entire connection rack away from the wall without disconnecting it) the extra length of cable stored in the slack take-up device is retrieved.

Figure 10:
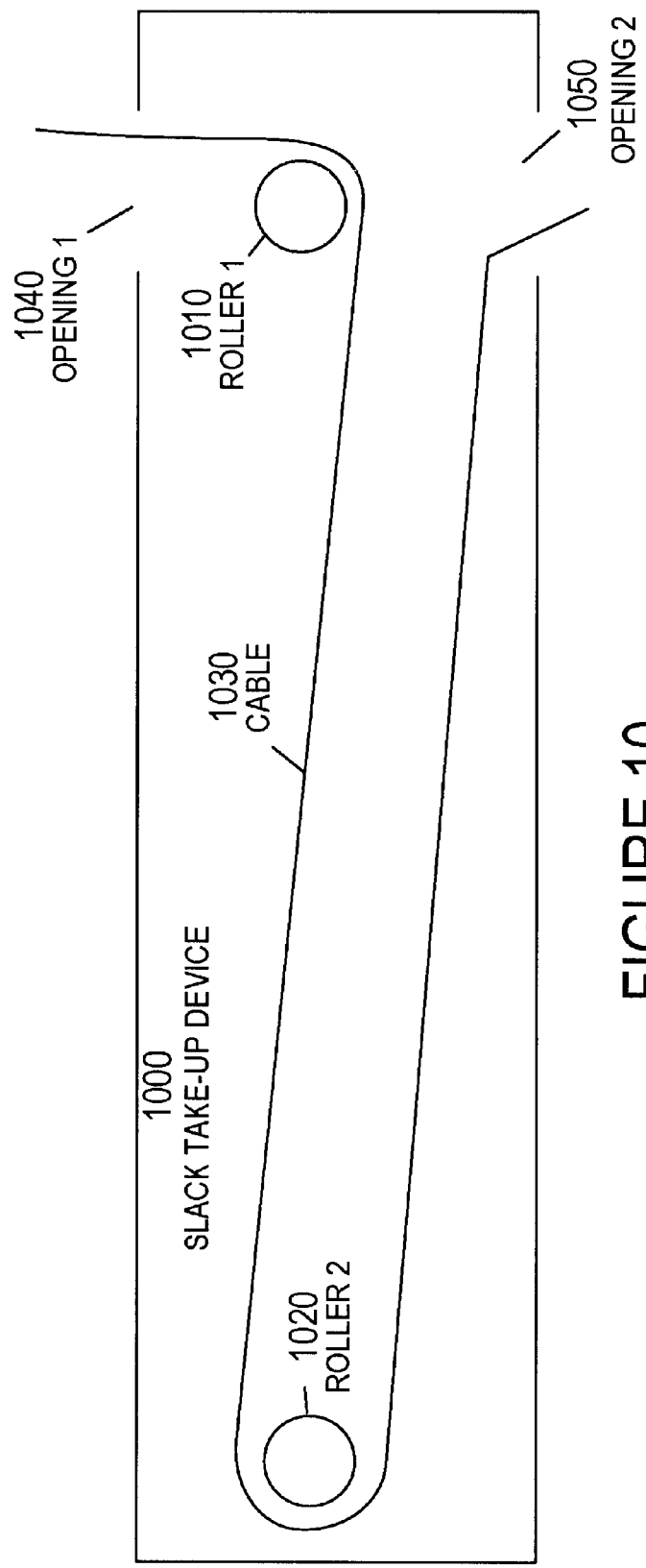
FIG. 10 is a block diagram of a slack take-up device in accordance with one embodiment of the present invention.

FIG. 10 illustrates a slack take-up device in accordance with one embodiment of the present invention. The slack take-up device (1000) contains roller 1 (1010) and roller 2 (1020). A cable (1030) is passed through opening 1 (1040), around roller 1, around roller 2 and through opening 2 (1050). To retrieve the extra length of cable from the slack take-up device, cable is pulled from the device. As the cable is pulled, roller 2 moves towards roller 1. As tension on the cable is reduced and the cable goes slack, roller 2 moves away from roller 1 and the extra length of cable is stored in the device. In one embodiment, a slack take-up device is used to store extra length of cable connecting components to other components. In another embodiment, a slack take-up device is used to store extra length of cable connecting components to system components outside the connection rack. In yet another embodiment, a slack take-up device is used to store extra length of cable connecting the connection rack to the power source.

Thus, a method and apparatus for efficient electronics positioning and connection systems is described in conjunction with one or more specific embodiments. The invention is defined by the following claims and their full scope and equivalents.

What is claimed is:

1. A method for connecting a plurality of electronic components comprising:

arranging one or more electronic components in a connection rack wherein a connector on each of said electronic components faces in a front direction wherein said front direction is open to allow access to said connector; and inserting said electronic components into said connection rack wherein said electronic components enter said connection rack through a side wherein said side faces a second direction wherein said second direction is not opposite said front direction.

2. The method of claim 1 wherein said second direction is said front direction.

3. The method of claim 1 wherein said second direction is perpendicular to said front direction.

4. The method of claim 1 further comprising:

positioning said connection rack wherein a back side is against a surface wherein said back side faces a back direction wherein said back direction is opposite said front direction.

5. The method of claim 1 further comprising:

providing a power supply wherein said power supply couples to a common power line; and coupling said electronic components to said common power line.

6. The method of claim 1 further comprising:

storing an extra length of a cable in a slack take-up device.

7. The method of claim 4 wherein said surface is a wall.

8. The method of claim 4 wherein said surface is a second connection rack.

9. The method of claim 5 further comprising:

positioning said power supply at a top position of said connection rack.

10. An electronic component connection device comprising:

a connection rack wherein one or more electronic components are arranged wherein a connector on each of said electronic components faces in a front direction of said connection rack wherein said front direction is open to allow access to said connector; and a side wherein said electronic components are inserted into said connection rack through said side wherein said side faces a second direction wherein said second direction is not opposite said front direction.

11. The electronic component connection device of claim 10 wherein said second direction is said front direction.

12. The electronic component connection device of claim 10 wherein said second direction is perpendicular to said front direction.

13. The electronic component connection device of claim 10 further comprising:

a positioning unit configured to position said connection rack wherein a back side is against a surface wherein said back side faces a back direction wherein said back direction is opposite said front direction.

14. The electronic component connection device of claim 10 further comprising:

a power supply wherein said power supply couples to a common power line; and a coupling device configured to couple said electronic components to said common power line.

15. The electronic component connection device of claim 13 wherein said surface is a wall.

16. The electronic component connection device of claim 13 wherein said surface is a second connection rack.

17. The electronic component connection device of claim 16 further comprising:

a positioning unit configured to position said power supply at a top position of said connection rack.

18. The electronic component connection device of claim 16 further comprising:

a slack take-up device configured to store an extra length of a cable.

19. A method for connecting a plurality of electronic components comprising:

arranging one or more electronic components in a connection rack wherein a connector on each of said electronic components faces in a front direction wherein said front direction is open to allow access to said connector;

inserting said electronic components into said connection rack wherein said electronic components enter said connection rack through a side wherein said side faces a second direction wherein said second direction is not opposite said front direction; and positioning said connection rack wherein a back side is against a second connection rack wherein said back side faces a back direction wherein said back direction is opposite said front direction.

20. A method for connecting a plurality of electronic components comprising:

arranging one or more electronic components in a connection rack wherein a connector on each of said electronic components faces in a front direction wherein said front direction is open to allow access to said connector;

inserting said electronic components into said connection rack wherein said electronic components enter said connection rack through a side wherein said side faces a second direction wherein said second direction is not opposite said front direction;

providing a power supply wherein said power supply couples to a common power line; and coupling said electronic components to said common power line.

21. The method of claim 20 further comprising:

positioning said power supply at a top position of said connection rack.

22. A method for connecting a plurality of electronic components comprising:

arranging one or more electronic components in a connection rack wherein a connector on each of said electronic components faces in a front direction wherein said front direction is open to allow access to said connector;

inserting said electronic components into said connection rack wherein said electronic components enter said connection rack through a side wherein said side faces a second direction wherein said second direction is not opposite said front direction; and storing an extra length of a cable in a slack take-up device.

23. An electronic component connection device comprising:

a connection rack wherein one or more electronic components are arranged wherein a connector on each of said electronic components faces in a front direction of said connection rack wherein said front direction is open to allow access to said connector;

a side wherein said electronic components are inserted into said connection rack through said side wherein said side faces a second direction wherein said second direction is not opposite said front direction; and a positioning unit configured to position said connection rack wherein a back side is against a second connection rack wherein said back side faces a back direction wherein said back direction is opposite said front direction.

24. An electronic component connection device comprising:

a connection rack wherein one or more electronic components are arranged wherein a connector on each of said electronic components faces in a front direction of said connection rack wherein said front direction is open to allow access to said connector;

a side wherein said electronic components are inserted into said connection rack through said side wherein said side faces a second direction wherein said second direction is not opposite said front direction;

a power supply wherein said power supply couples to a common power line; and a coupling device configured to couple said electronic components to said common power line.

25. The electronic component connection device of claim 24 further comprising:

a positioning unit configured to position said power supply at a top position of said connection rack.

26. The electronic component connection device of claim 24 further comprising:

a slack take-up device configured to store an extra length of a cable.

* * * * *